(12) United States Patent
Strobel et al.

(10) Patent No.: US 10,533,132 B2
(45) Date of Patent: Jan. 14, 2020

(54) LUMINESCENT MATERIALS

(71) Applicants: Lumileds Holding B.V., Schiphol (NL); Ludwig-Maximilians-Universitaet Muenchen, Munich (DE)

(72) Inventors: Philipp-Jean Strobel, Aachen (DE); Peter Josef Schmidt, Aachen (DE); Wolfgang Schnick, Gauting (DE)

(73) Assignees: Lumileds Holding B.V. (NL); Ludwig-Maximillians-Universitaet Muenchen (DE)

( * ) Notice: Subject to any disclaimer, the term of this patent is extended or adjusted under 35 U.S.C. 154(b) by 0 days.

(21) Appl. No.: 16/360,861

(22) Filed: Mar. 21, 2019

(65) Prior Publication Data

US 2019/0322932 A1    Oct. 24, 2019

(30) Foreign Application Priority Data

Apr. 24, 2018    (EP) .................................... 18168998

(51) Int. Cl.
*C09K 11/77*    (2006.01)
*H01L 33/50*    (2010.01)

(52) U.S. Cl.
CPC ........ *C09K 11/7703* (2013.01); *H01L 33/504* (2013.01)

(58) Field of Classification Search
CPC .. C09K 11/7703; H01L 33/502; H01L 33/504
See application file for complete search history.

(56) References Cited

U.S. PATENT DOCUMENTS

| | | | |
|---|---|---|---|
| 6,500,364 B2 * | 12/2002 | Reynolds ................. | C01F 3/00 252/584 |
| 7,938,983 B2 | 5/2011 | Muellr-Mach et al. | |
| 2012/0126687 A1 | 5/2012 | Juang et al. | |
| 2016/0244664 A1 | 8/2016 | Tucks et al. | |

FOREIGN PATENT DOCUMENTS

| | | |
|---|---|---|
| JP | 2009132928 A | 6/2018 |
| WO | 20122033122 A1 | 3/2012 |

\* cited by examiner

*Primary Examiner* — C Melissa Koslow

(57) ABSTRACT

Embodiments of the invention include a semiconductor light emitting device with a light emitting layer disposed between an n-type region and a p-type region. The light emitting layer emits first light. The device further includes $AE_{1-x}Li_2Be_4O_6$:$Eu_x$, wherein AE=one or more of Sr, Ba, Ca, disposed in the path of the first light. The $AE_{1-x}Li_2Be_4O_6$:$Eu_x$ absorbs first light and emits second light. In some embodiments, the first light and second light may be blue.

13 Claims, 5 Drawing Sheets

LUMINESCENT MATERIALS

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. The use of a blue-emitting phosphor is known. For example, U.S. Pat. No. 7,938,983 teaches dichromatic and polychromatic white-emitting phosphor-converted LEDs. "A white-light emitting illumination system according to the invention can advantageously be produced by choosing the fluorescent material such that a UV radiation emitted by the UV light emitting diode is converted into complementary wavelength ranges, to form dichromatic white light. In this case, the amber and blue light is produced by means of the fluorescent materials . . . Blue light is produced by means of the fluorescent materials that comprise a blue phosphor selected from the group comprising $BaMgAl_{10}O_{17}:Eu_x$ $Ba_5SiO_4(Cl, Br)_6Eu$, $CaLa_2S_4:Ce$, $(Sr,Ba,Ca)_5(PO_4)_3Cl:Eu$ and $LaSi_3N_5:Ce$."

"In a further embodiment, a white-light emitting illumination system according to the invention can advantageously be produced by choosing the fluorescent material such that UV radiation emitted by a UV emitting diode is converted into complementary wavelength ranges, to form polychromatic white light e.g. by additive color triads, for example blue, green and red."

WO 2012033122 teaches "A blue-light-emitting phosphor which has a basic compositional formula $Sr_{3-x}MgSi_2O_8:Eu_x$ (wherein x represents a numeral value falling within the range from 0.008 to 0.110), has the same crystalline structure as that of merwinite, and has a crystal lattice strain of 0.080% or less as determined by a Le Bail method from an X-ray diffraction pattern at diffraction angle 2θ of 20-130°, wherein the X-ray diffraction pattern is determined using a CuKα ray having an incident angle of θ. The blue-light-emitting phosphor can be used advantageously as a blue-light-emitting material for a light-emitting device which comprises a semiconductor light-emitting element that can emit light having a wavelength of 350-430 nm upon the conduction of an electrical current, such as a white LED lamp, and a blue-light-emitting material that can emit blue light upon the excitation with light emitted by the semiconductor light-emitting element."

SUMMARY

Embodiments of the invention include a semiconductor light emitting device with a light emitting layer disposed between an n-type region and a p-type region. The light emitting layer emits first light. The device further includes $AE_{1-x}Li_2Be_4O_6:Eu_x$, wherein AE=one or more of Sr, Ba, Ca, disposed in the path of the first light. The $AE_{1-x}Li_2Be_4O_6:Eu_x$ absorbs first light and emits second light. In some embodiments, the first light and second light may be blue.

DETAILED DESCRIPTION OF THE PREFERRED EMBODIMENTS

Figure 1:
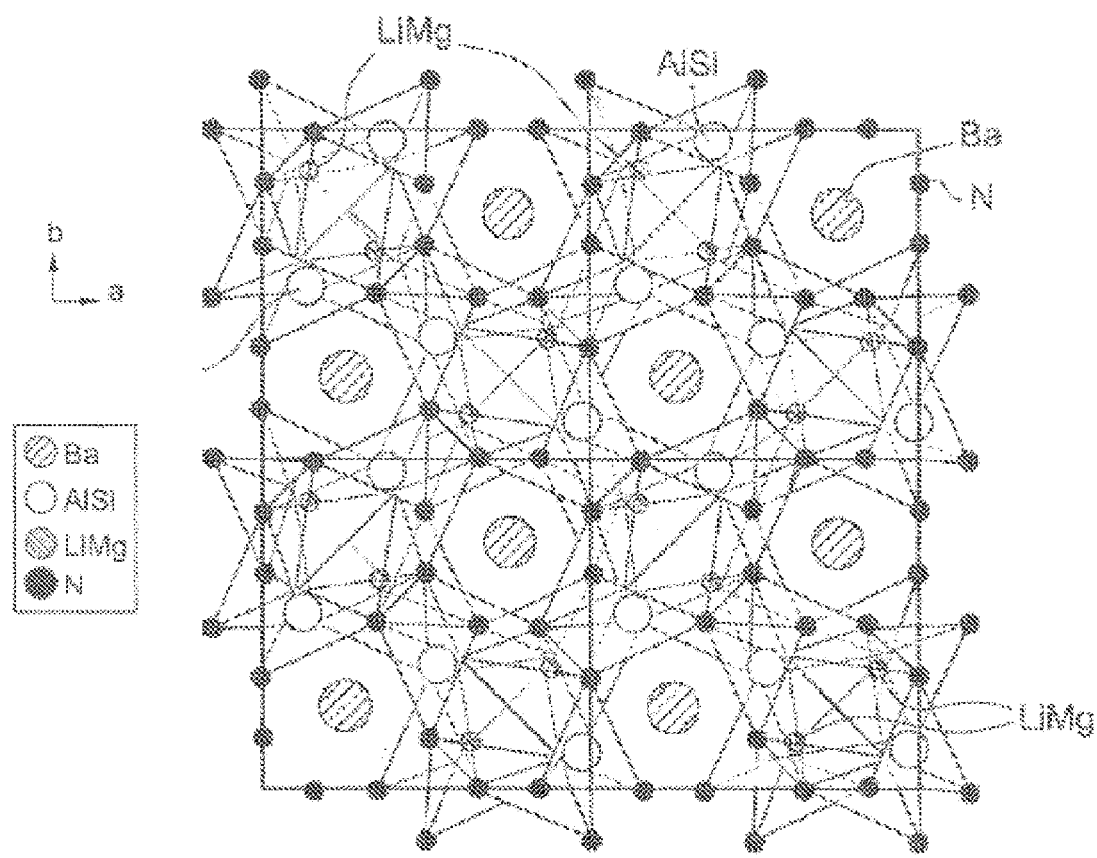
FIG. 1 illustrates a crystal structure that is isotypic with $AE_{1-x}Li_2Be_4O_6:Eu_x$.

Embodiments of the invention include blue emitting phosphors $AE_{1-x}Li_2Be_4O_6:Eu_x$ (AE=one or more of Sr, Ba, Ca; $0.002<x\leq0.4$). These narrow-band blue emitting phosphors may emit blue light, light having a peak wavelength of at least 440 nm in some embodiments, at least 450 nm in some embodiments, and no more than 470 nm in some embodiments, with spectral widths of full width half maximum (FWHM) of 25-26 nm. The narrow band width is caused by a very small Stokes shift that allows excitation of the claimed phosphors by light having a peak wavelength in the range UV-blue, up to wavelengths of 440 nm.

The blue emitting phosphors may be used, for example, in a phosphor converted LED. For example, a UV- or blue-emitting LED may be used to pump, for example, red, green, and blue emitting phosphor mixtures including $AE_{1-x}Li_2Be_4O_6:Eu_x$. Such a device may have benefits. First, when compared with a conventional blue emitting LED combined with red and green phosphors, in some embodiments the overall efficiency may be increased by minimizing the down conversion loss while providing the advantage of a high color point stability regardless of variation of the pump LED emission wavelength. Second, in some embodiments, the amount of blue phosphor needed is reduced in devices including a Ce doped garnet phosphor (for emitting, for example, yellow-green light), because a pump LED emitting at or near 440 nm can also excite the garnet phosphors.

In some embodiments, $AE_{1-x}Li_2Be_4O_6:Eu_x$ crystallizes in a crystal structure that is isotypic with green emitting nitride phosphors described in US 20160244664, which is incorporated herein by reference. Paragraph 5 of US 20160244664 teaches "A new class of phosphor materials described by the general composition $M_{1-x-y-z}Z_zA_aB_b C_cD_dE_eN_{6-n}O_n:ES_x,RE_y$, where M is a divalent element selected from Ca (calcium), Sr (strontium), Ba (barium), Z is a monovalent element selected from Na (sodium), K (potassium), Rb (rubidium), A is a monovalent element selected from Li (lithium), Cu (copper), B is a divalent element selected from Mg (magnesium), Mn (manganese), Zn (zinc), Cd (cadmium), C is a trivalent element selected from B (boron), Al (aluminum), Ga (gallium), D is a tetravalent element selected from Si (silicon), Ge (germanium), Ti (titanium), Hf (hafnium), E is a pentavalent element selected from P (phosphorous), V (vanadium), Nb (niobium), Ta (tantalum), ES is a divalent rare earth element selected from Eu (europium), Sm (samarium) and Yb (ytterbium), RE is a trivalent rare earth element selected from Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium) has been found. The compositional range is further especially defined by $0 \leq x \leq 0.2$, $0 \leq y \leq 0.2$, especially $0 < x+y \leq 0.4$, $0 \leq z < 1$, $x+y+z < 1$, especially $0 \leq n < 0.75$, $a+b=2$, $c+d+e=4$, and $a+2b+3c+4d+5e+y-z=16-n$."

Paragraph 6 of US 20160244664 teaches "These compounds crystallize in a new crystal structure . . . that has hitherto not been described in the literature." The crystal structure is illustrated in FIG. 1. "In this structure, M and Z are coordinated by 8 N ligands (twisted cube), while A, B, C, D, and E are located in corner and edge-sharing $[XN_4]$ tetrahedra (X=A, B, C, D, E). The resulting highly condensed host lattice can be modified by interchanging cations of appropriate size . . . These substitutions result in changes in bond lengths (causing changes in lattice parameters) and changes in polarization of cation-ligand bonds that also affect the energy states of activator ions in the lattice. Therefore it is possible to shift the emission band of e.g. $BaLi_2Al_2Si_2N_6:Eu$ towards longer peak wavelengths by substituting Si by Al to increase the charge density of the Eu-coordinating ligands (charge compensation in the A/B sublattice, e.g. Mg replacing Li) or by substituting Ba by cations that cause a shrinkage of the lattice and a shortening of activator-ligand distances. Increasing the Eu concentration results in a red-shifted and broadened emission profile, which is a well-known effect for many $Eu^2$ phosphors. The different effects of cation size and charge combined with the influence of different types of cation sites in the lattice (A, B vs. C, D, E) enables a variety of tuning options for the spectral emission shape and position."

The narrow emission and small Stokes shift of $AE_{1-x}Li_2Be_4O_6:Eu_x$ is a consequence of the highly condensed, rigid host lattice structure that creates a single site populated by the Eu(II) activator ions with an eightfold coordination that effectively restricts geometric relaxation in the excited activator state. Furthermore, $AE_{1-x}Li_2Be_4O_6:Eu_x$ does not show an inhomogeneous broadening of the emission as consequence of a statistical occupation of host lattice cation sites observed for the isotypic nitridoalumosilicates described in US 20160244664.

The emission band position of $AE_{1-x}Li_2Be_4O_6:Eu$ may be tuned to some extent by replacing a larger alkaline earth cation AE by a smaller one (Ba is larger than Sr while Sr is larger than Ca) which leads to a spectroscopic red shift of absorption and emission bands in the 450-470 nm range.

$AE_{1-x}Li_2Be_4O_6:Eu_x$ (AE=Sr, Ba, Ca) can be prepared from any suitable commercially available starting compounds including, for example, alkaline earth (AE) carbonates, lithium carbonate and beryllium oxide. The dopant Eu can be introduced by any suitable material including, for example, $Eu_2O_3$, $EuF_3$ or $EuCl_3$. Any suitable additives such as fluxes and/or sintering aids can be added, such as, for example, boron oxide, $BaF_2$ or LiF.

$AE_{1-x}Li_2Be_4O_6:Eu_x$ may be processed in powder form in some embodiments. The properties of $AE_{1-x}Li_2Be_4O_6:Eu$ in powder form may be engineered by application of particle coatings, for example to enhance the light absorption properties and/or to increase the stability of the powder (i.e., to reduce or eliminate degradation of the luminescence function). The powder phosphor may be disposed in a transparent matrix (described below) that is amorphous, such as silicone or glass, or crystalline, such as an alkaline earth halide such as calcium fluoride.

$AE_{1-x}Li_2Be_4O_6:Eu_x$ powders may be processed into polycrystalline luminescent ceramic bodies in some embodiments. As used herein, "luminescent ceramic" refers to a phosphor formed into a structure that is monolithic slab or tile that is self supporting (i.e., a self supporting structure can be formed and handled separately from the light source). The phosphor may be, for example, powder pressed and sintered, such that other than the phosphor itself, no binder material is necessary to form the tile. The luminescent ceramic may be a dense, polycrystalline structure. In some embodiments, the luminescent ceramic is so dense that porosity in the luminescent ceramic is limited to no more than 1 volume-%.

In some embodiments, a luminescent ceramic is formed as follows: powder phosphor is predensified to a green body and sintered to a polycrystalline ceramic. The predensification to the green body may be done by any suitable method including, for example, pressing or tape casting, while the sintering may be done under normal pressure conditions or under gas pressure conditions, both in an inert gas atmosphere like nitrogen or forming gas. The luminescent ceramic may be fired at temperatures in the 800-1500° C. range in some embodiments, in the 1000°–1350° C. range in some embodiments, and in the 1100-1250° C. range in some embodiments.

Figure 2:
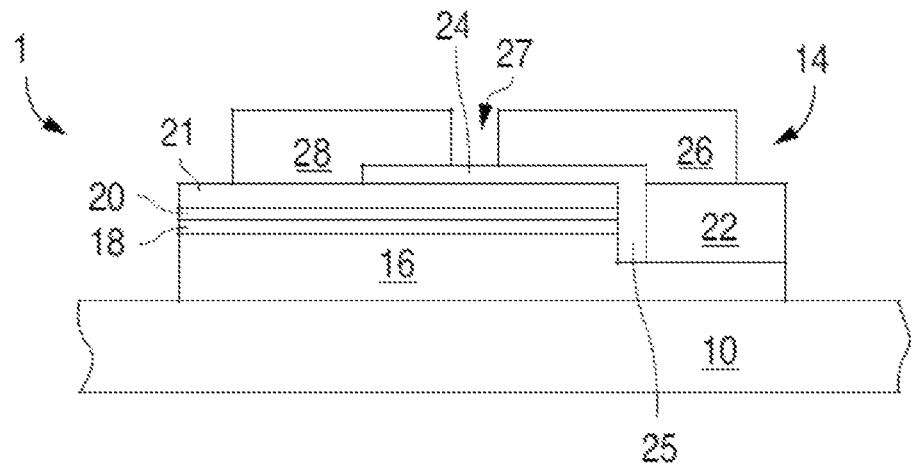
FIG. 2 is a cross sectional view of an LED.

The phosphors described herein may be used, for example, in a light source including a light emitting diode. Light emitted by the light emitting diode is absorbed by the phosphor according to embodiments of the invention and emitted at a different wavelength. FIG. 2 illustrates one example of a suitable light emitting diode, a III-nitride LED that emits UV or blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure 14 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 2. The light source, such as, for example, the LED illustrated in FIG. 2, is illustrated in the following figures by block 1.

Figure 3:
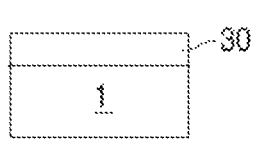
FIG. 3 is a cross sectional view of a device with a wavelength converting structure in direct contact with an LED.
Figure 4:
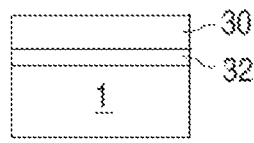
FIG. 4 is a cross sectional view of a device with a wavelength converting structure in close proximity to an LED.
Figure 5:
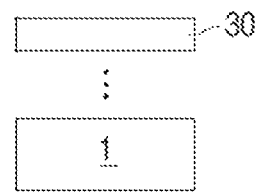
FIG. 5 is a cross sectional view of a device with a wavelength converting structure spaced apart from an LED.

FIGS. 3, 4, and 5 illustrate devices that combine an LED 1 and a wavelength converting structure 30. The wavelength converting structure may include the phosphors described herein.

In FIG. 3, the wavelength converting structure 30 is directly connected to the LED 1. For example, the wavelength converting structure may be directly connected to the substrate 10 illustrated in FIG. 2, or to the semiconductor structure, if the substrate 10 is removed.

In FIG. 4, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 5, the wavelength converting structure 30 is spaced apart from LED 1. The spacing between LED 1 and the wavelength converting structure 30 may be, for example, on the order of millimeters in some embodiments. Such a device may be referred to as a "remote phosphor" device. Remote phosphor arrangements may be used, for example, in backlights for displays.

The wavelength converting structure 30 may be square, rectangular, polygonal, hexagonal, circular, or any other suitable shape. The wavelength converting structure may be the same size as LED 1, larger than LED 1, or smaller than LED 1.

Examples of suitable wavelength converting structures include structures that are formed separately from LED 1, such the luminescent ceramic described above, powder phosphors that are disposed in transparent material such as silicone or glass and rolled, cast, or otherwise formed into a sheet, then singulated into individual wavelength converting structures, and wavelength converting materials such as powder phosphors that are disposed in a transparent material such as silicone that is formed into a flexible sheet, which may be laminated or otherwise disposed over an LED 1.

Examples of suitable wavelength converting structures include structures that are formed in situ with LED 1 or with the luminescent ceramics described above, such as powder phosphors that are mixed with a transparent material such as silicone and dispensed, screen printed, stenciled, molded, or otherwise disposed over LED 1, a luminescent ceramic, or any other suitable structure, and wavelength converting materials that are coated on LED 1, a luminescent ceramic, or any other suitable structure by electrophoretic, vapor, or any other suitable type of deposition.

In addition to the phosphors described herein, the wavelength converting structure 30 may also include, for example, other phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting structure absorbs light emitted by the LED and emits light of one or more different wavelengths. Unconverted light emitted by the LED may be part of the final spectrum of light extracted from the structure, though it need not be. In addition to the blue emitting phosphors described herein, for a device that emits light that appears white, the wavelength converting structure may include, for example, one or more of a yellow-emitting wavelength converting material, a green-emitting wavelength converting material, and a red-emitting wavelength converting material. Wavelength converting materials emitting other colors of light may be added to tailor the spectrum of light extracted from the structure.

In some embodiments, other materials may be added to the wavelength converting structure or applied to the LED 1, such as, for example, materials that improve optical performance, materials that encourage scattering, and/or materials that improve thermal performance.

The wavelength converting structure may include a single or multiple wavelength converting layers. For example, in some embodiments, the blue emitting phosphors described herein may be mixed with other phosphors and formed into a wavelength converting structure with a single layer of mixed phosphor. In some embodiments, the blue emitting phosphors described herein is part of wavelength converting structure where different phosphors are disposed in discrete layers. The discrete layers may be the same type of wavelength converting layer, or different types of layers may be combined. For example, the discrete layers may all be luminescent ceramics or powders disposed in a transparent matrix, or one discrete layer may be a luminescent ceramic combined with, for example, a second discrete layer that is a powder disposed in a transparent matrix. In some embodiments, in a wavelength converting structure with discrete layers, the layer including the blue emitting phosphors described herein is disposed closest to the LED 1, as the blue light emitted by the phosphor may pump the other wavelength converting material(s).

In some embodiments, small Stokes shift, saturated blue emitting phosphors such as those described herein may be used as off-state white coatings. An off-state coating alters the appearance of a phosphor converted LED when the device is not operating. LEDs are often coated with yellow and red emitting phosphors which may absorb ambient light and emit yellow or red light, which may be unappealing to a user viewing the LED in the off-state.

EXAMPLES

In some embodiments, the blue emitting phosphor is $BaLi_2Be_4O_6$:Eu(1%).

$BaLi_2Be_4O_6$:Eu(1%) may be synthesized as follows: 230.0 g (1.5 mole) BaO, 151.6 g (6.06 mole) BeO, 45.3 g (1.52 mole) $Li_2O$, and 2.7 g (0.008 mole) $Eu_2O_3$ are mixed and sintered under Ar atmosphere at 1100° C. for 1 h. The material shows block-like particles that may be de-aggregated or milled into powder form by any suitable technique including, for example, ball milling.

Figure 6:
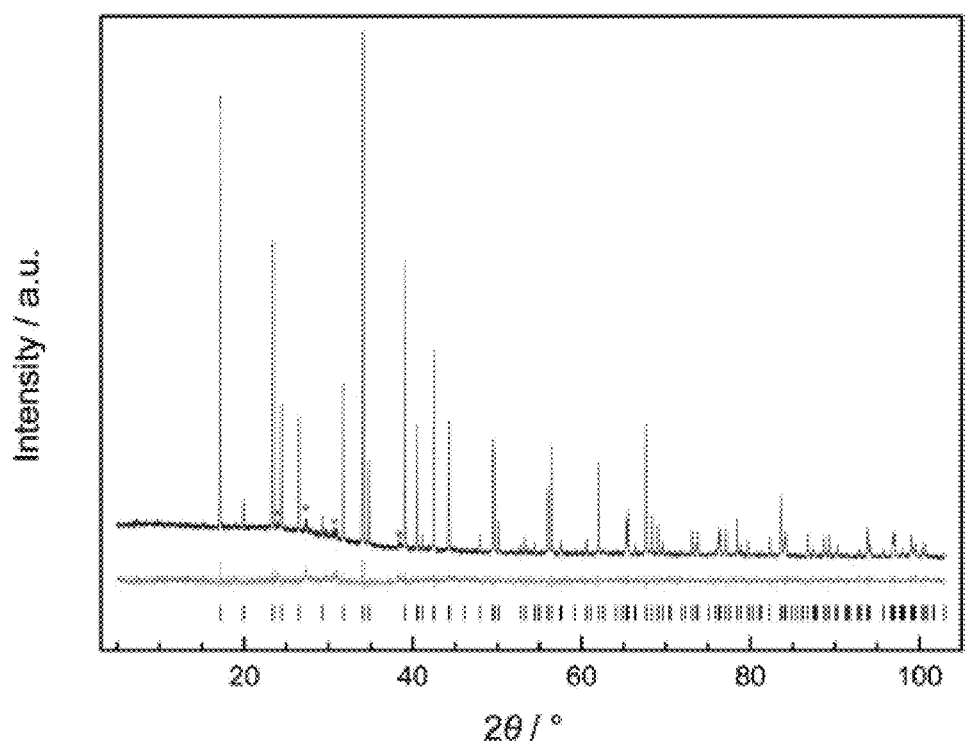
FIG. 6 illustrates the x-ray diffraction pattern of $BaLi_2Be_4O_6:Eu$.

FIG. 6 illustrates the x-ray diffraction (XRD) pattern (Cu Kα radiation) (top curve), Rietveld refinement (Cu Kα radiation) (middle curve), and reflection positions (bottom curve, asterisks imply an unknown impurity phase) of the raw phosphor powder $BaLi_2Be_4O_6$:Eu.

$BaLi_2Be_4O_6$:Eu crystallizes in space group P4/ncc (No. 130) with the cell parameters a=7.2770 Å and c=8.8872 Å. P4/ncc is the symbol of the crystallographic space group that describes the symmetry of the crystal lattice according to INTERNATIONAL TABLES FOR CRYSTALLOGRAPHY, Volume A1, SYMMETRY RELATIONS BETWEEN SPACE GROUPS. Eds. H. Wondratscheck and U. Mueller, Kluwer Academic Publishers, Dordrecht (2004). Table 1 summarizes the atomic parameters of the $BaLi_2Be_4O_6$ crystal structure. Atom is the species that occupies a lattice site with a specific Wyckoff position (Wyck.). Headings x/a, y/b and z/c refer to the coordinates of the atomic positions in the crystal lattice that is defined by the lattice constants a, b and c. In the tetragonal lattice system a=b≠c and α=β=γ=90°.

TABLE 1

| Atom | Wyck. | x/a | y/b | z/c |
|------|-------|-----|-----|-----|
| Ba1 | 4c | ¼ | ¼ | 0.32551(2) |
| Be1 | 16g | 0.1207(3) | 0.5337(3) | 0.0766(2) |
| Li1 | 8f | 0.3665(4) | 0.6335(4) | ¼ |
| O1 | 16g | 0.50530(15) | 0.15991(16) | 0.04538(12) |
| O2 | 8f | 0.59636(15) | 0.40364(15) | ¼ |

The crystal structure of $AELi_2Be_4O_6$ (AE=Sr,Ba) is isotypic to $BaLi_2Al_2Si_2N_6$. N-ligands are exchanged by O, the mixed-occupied Al/Si site is exchanged by Be. Corner- and edge-sharing $BeO_4$-tetrahedra build a rigid network, forming two different channels. The first channel is filled with Li atoms. Li atoms are in a 4+1 coordination by O. The second channel is filled by AE (AE=Sr,Ba) atoms. AE is coordinated 8-fold, the coordination sphere can be described as a truncated square pyramid.

Energy-dispersive X-ray spectroscopy (EDS) scans of $BaLi_2Be_4O_6$:Eu show a Ba:O ratio of 1:6. Inductively coupled plasma mass spectrometry (ICP) analysis of $BaLi_2Be_4O_6$:Eu shows a ratio of Ba:Li:Be of 1.8:2:4.4.

Figure 7:
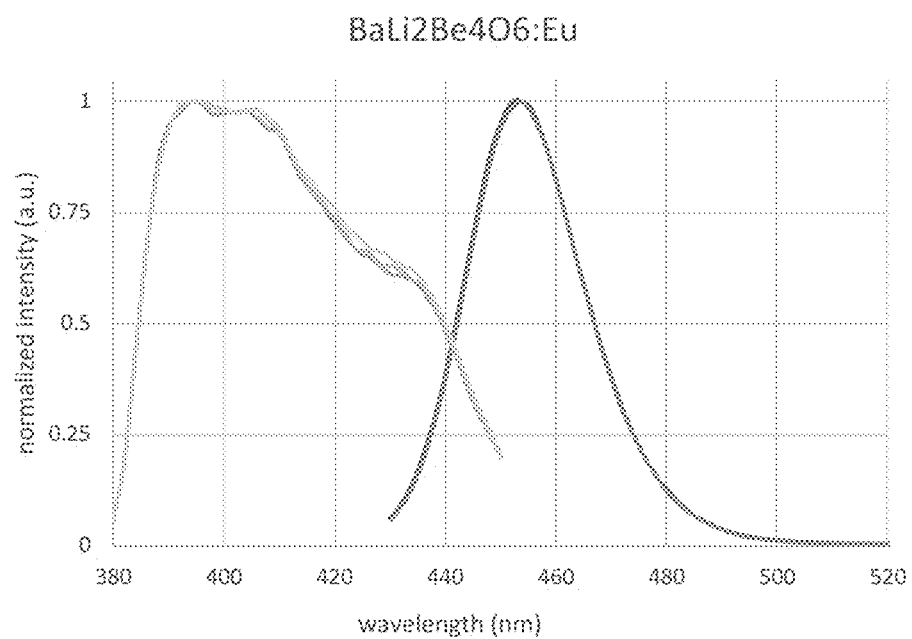
FIG. 7 illustrates the excitation and emission spectra of $BaLi_2Be_4O_6:Eu$.

FIG. 7 illustrates the single crystal excitation (left curve) and emission (right curve) spectra of $BaLi_2Be_4O_6$:Eu(1%).

In some embodiments, the blue emitting phosphor is $SrLi_2Be_4O_6$:Eu(1%).

$SrLi_2Be_4O_6$:Eu(1%) may be synthesized as follows: 155.4 g (1.5 mole) SrO, 151.6 g (6.06 mole) BeO, 45.3 g (1.52 mole) $Li_2O$, and 2.7 g (0.008 mole) $Eu_2O_3$ are mixed and sintered under Ar atmosphere at 1100° C. for 0.5 h.

Figure 8:
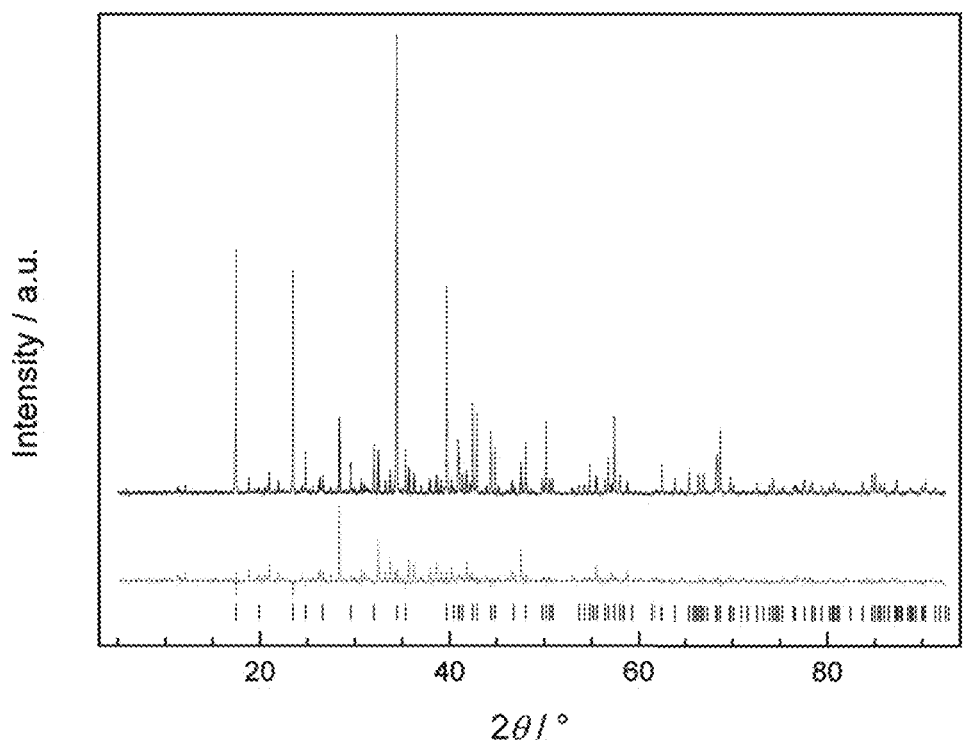
FIG. 8 illustrates the x-ray diffraction pattern of $SrLi_2Be_4O_6:Eu$.

FIG. 8 illustrates the XRD pattern (Cu Kα radiation) (top curve), Rietveld refinement (Cu Kα radiation) (middle curve), and reflection positions (bottom curve) of the raw phosphor powder $SrLi_2Be_4O_6$:Eu.

$SrLi_2Be_4O_6$:Eu crystallizes in space group P4/ncc (No. 130) with the cell parameters a=7.1659 Å and c=8.9085 Å and is isotypic to $BaLi_2Be_4O_6$:Eu.

Table 2 summarizes the atomic parameters of the $SrLi_2Be_4O_6$:Eu crystal structure.

TABLE 2

| Atom | Wyck. | x/a | y/b | z/c |
|------|-------|-----|-----|-----|
| Sr1 | 4c | ¼ | ¼ | 0.34572(3) |
| Be1 | 16g | 0.1197(3) | 0.5311(3) | 0.0776(2) |
| Li1 | 8f | 0.3697(4) | 0.6303(4) | ¼ |
| O1 | 16g | 0.50309(13) | 0.16231(15) | 0.04168(10) |
| O2 | 8f | 0.59096(15) | 0.40904(15) | ¼ |

EDS scans of $SrLi_2Be_4O_6$:Eu show a Sr:O:Eu ratio of 1:4.7:0.007. ICP analysis shows a ratio of Sr:Li:Be of 1:1.5:3.6.

Figure 9:
FIG. 9 illustrates the excitation and emission spectra of $SrLi_2Be_4O_6:Eu$.

FIG. 9 illustrates the single crystal excitation (left curve) and emission (right curve) spectra of $SrLi_2Be_4O_6$:Eu(1%).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A luminescent material comprising $AE_{1-x}Li_2Be_4O_6$:$Eu_x$, wherein AE=one or more of Sr, Ba, Ca and 0.002<x≤0.4.

2. The luminescent material of claim 1 wherein the luminescent material emits light having a peak wavelength in the range 440-470 nm.

3. The luminescent material of claim 1 wherein the luminescent material has a spectral widths of full width half maximum (FWHM) of 25-26 nm.

4. The luminescent material of claim 1 wherein the luminescent material has a crystal structure that is isotypic with $M_{1-x-y-z}Z_zA_aB_bC_cD_dE_eN_{6-n}O_n:ES_x,RE_y$, wherein:
 a. M is a divalent element selected from Ca (calcium), Sr (strontium), and Ba (barium);
 b. Z is a monovalent element selected from Na (sodium), K (potassium), and Rb (rubidium);
 c. A is a monovalent element selected from Li (lithium), and Cu (copper);
 d. B is a divalent element selected from Mg (magnesium), Mn (manganese), Zn (zinc), and Cd (cadmium);
 e. C is a trivalent element selected from B (boron), Al (aluminum), and Ga (gallium);
 f. D is a tetravalent element selected from Si (silicon), Ge (germanium), Ti (titanium), and Hf (hafnium);
 g. E is a pentavalent element selected from P (phosphorous), V (vanadium), Nb (niobium), and Ta (tantalum);
 h. ES is a divalent rare earth element selected from Eu (europium), Sm (samarium) and Yb (ytterbium);
 i. RE is a trivalent rare earth element selected from Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium);
 j. $0 \leq x \leq 0.2$;
 k. $0 \leq y \leq 0.2$;
 l. $0 < x+y \leq 0.4$;
 m. $0 \leq z < 1$;
 n. $x+y+z < 1$;
 o. $0 \leq n < 0.75$;
 p. $a+b=2$;
 q. $c+d+e=4$l and
 r. $a+2b+3c+4d+5e+y-z=16-n$.

5. The luminescent material of claim 1 wherein the luminescent material has a lattice structure comprising a single site populated by the Eu(II) activator ions with an eightfold coordination.

6. A device comprising:
 a. a semiconductor light emitting device comprising a light emitting layer disposed between an n-type region and a p-type region, the light emitting layer emitting first light; and
 b. the luminescent material according to claim 1 disposed in the path of the first light, wherein the luminescent material absorbs first light and emits second light.

7. The device of claim 6 wherein the first light is blue light.

8. The device of claim 6 wherein the second light is blue light.

9. The device of claim 6 further comprising a green emitting luminescent material and a red emitting luminescent material disposed in the path of the first light.

10. The device of claim 9 wherein the red emitting luminescent material is disposed in the path of the second light.

11. The device of claim 6 wherein the $AE_{1-x}Li_2Be_4O_6:Eu_x$ is a ceramic body.

12. The device of claim 6 wherein the $AE_{1-x}Li_2Be_4O_6:Eu_x$ is a powder disposed in a transparent matrix.

13. The device of claim 12 wherein the transparent matrix is selected from the group consisting of a crystalline material, an alkaline earth halide, and calcium.

* * * * *